(12) United States Patent
Dong et al.

(10) Patent No.: US 11,228,006 B2
(45) Date of Patent: Jan. 18, 2022

(54) ORGANIC LIGHT-EMITTING DIODE DISPLAY SUBSTRATE, MANUFACTURING METHOD THEREOF, PACKAGING STRUCTURE AND DISPLAY DEVICE

(71) Applicants: BOE TECHNOLOGY GROUP CO., LTD., Beijing (CN); CHENGDU BOE OPTOELECTRONICS TECHNOLOGY CO., LTD., Sichuan (CN)

(72) Inventors: Xiangdan Dong, Beijing (CN); Youngyik Ko, Beijing (CN); Jinsan Park, Beijing (CN); Wanli Dong, Beijing (CN)

(73) Assignees: BOE TECHNOLOGY GROUP CO., LTD., Beijing (CN); CHENGDU BOE OPTOELECTRONICS TECHNOLOGY CO., LTD., Sichuan (CN)

( * ) Notice: Subject to any disclaimer, the term of this patent is extended or adjusted under 35 U.S.C. 154(b) by 591 days.

(21) Appl. No.: 16/097,699

(22) PCT Filed: Feb. 5, 2018

(86) PCT No.: PCT/CN2018/075229
§ 371 (c)(1),
(2) Date: Oct. 30, 2018

(87) PCT Pub. No.: WO2018/223721
PCT Pub. Date: Dec. 13, 2018

(65) Prior Publication Data
US 2021/0226138 A1    Jul. 22, 2021

(30) Foreign Application Priority Data
Jun. 8, 2017 (CN) .......................... 201710427262.X

(51) Int. Cl.
*H01L 51/00* (2006.01)
*H01L 51/56* (2006.01)

(52) U.S. Cl.
CPC .......... *H01L 51/0097* (2013.01); *H01L 51/56* (2013.01); *H01L 2251/566* (2013.01)

(58) Field of Classification Search
CPC ................. H01L 51/0097; H01L 51/56; H01L 2251/566
See application file for complete search history.

(56) References Cited

U.S. PATENT DOCUMENTS

| 2013/0113368 A1 | 5/2013 | Min |
| 2015/0228927 A1* | 8/2015 | Kim .................... H01L 51/5203 257/40 |

(Continued)

FOREIGN PATENT DOCUMENTS

| CN | 102082237 A | 6/2011 |
| CN | 102130300 A | 7/2011 |

(Continued)

OTHER PUBLICATIONS

First Office Action for Chinese Application No. 201710427262.X, dated May 2, 2018, 5 Pages.

(Continued)

*Primary Examiner* — Kyoung Lee
(74) *Attorney, Agent, or Firm* — Brooks Kushman P.C.

(57) ABSTRACT

An OLED display substrate, a manufacturing method thereof, a packaging structure and a display device are provided. The OLED display substrate includes a display region, a barrier structure arranged at a periphery of the OLED display substrate, and a cathode lapping region arranged between the display region and the barrier structure. The OLED display substrate has an uneven surface at the cathode lapping region.

17 Claims, 2 Drawing Sheets

(56) References Cited

U.S. PATENT DOCUMENTS

2015/0380685 A1    12/2015  Lee et al.
2016/0064691 A1     3/2016  Lee et al.
2016/0365395 A1    12/2016  Xu et al.
2017/0047518 A1     2/2017  Hung et al.

FOREIGN PATENT DOCUMENTS

| CN | 202067837 U | 12/2011 |
| CN | 104795426 A | 7/2015 |
| CN | 105390525 A | 3/2016 |
| CN | 206134686 U | 4/2017 |
| CN | 106783933 A | 5/2017 |
| CN | 107046105 A | 8/2017 |

OTHER PUBLICATIONS

International Search Report and Written Opinion for Application No. PCT/CN2018/075229, dated May 16, 2018, 11 Pages.

* cited by examiner

ORGANIC LIGHT-EMITTING DIODE DISPLAY SUBSTRATE, MANUFACTURING METHOD THEREOF, PACKAGING STRUCTURE AND DISPLAY DEVICE

CROSS-REFERENCE TO RELATED APPLICATION APPLICATIONS

This application is the U.S. national phase of PCT Application No. PCT/CN2018/075229 filed on Feb. 5, 2018, which claims priority to Chinese Patent Application No. 201710427262.X filed on Jun. 8, 2017, which are incorporated herein by reference in their entireties.

The present application claims a priority of the Chinese patent application No. 201710427262.X filed on Jun. 8, 2017, which is incorporated herein by reference in its entirety.

TECHNICAL FIELD

The present disclosure relates to the field of display technology, in particular to an organic light-emitting diode (OLED) display substrate, a manufacturing method thereof, a packaging structure and a display device.

BACKGROUND

A process for manufacturing a flexible OLED packaging structure mainly includes preparing a flexible substrate, forming a first gate insulation layer, forming a first gate metal layer pattern, forming a second gate insulation layer, forming a second gate metal layer pattern, forming an interlayer insulation layer, forming a source-drain metal layer pattern, forming a planarization layer, forming an anode, forming a pixel definition layer, forming a spacer layer, forming a cathode and forming a packaging thin film layer. The packaging thin film layer includes an organic thin film and an inorganic thin film laminated one on another. During the formation of the organic thin film, a rheological organic material, e.g., an acrylic material, is applied to a to-be-filed region surrounded by a barrier through an ink-jet printing process, and then solidified to form the organic thin film. When the rheological organic material extends beyond the to-be-filled region surrounded by the barrier, the hermeticity of the packaging thin film layer may be adversely affected, and thereby a display effect of a resultant display device may be adversely affected too.

SUMMARY

In one aspect, the present disclosure provides in some embodiments an OLED display substrate, including a display region, a barrier structure arranged at a periphery of the OLED display substrate, and a cathode lapping region arranged between the display region and the barrier structure. The OLED display substrate has an uneven surface at the cathode lapping region.

In a possible embodiment of the present disclosure, the OLED display substrate includes a planarization layer, an anode layer and a cathode layer arranged at the cathode lapping region and laminated one on another, and the planarization layer has an uneven surface at the cathode lapping region.

In a possible embodiment of the present disclosure, the OLED display substrate includes a planarization layer, an anode layer and a cathode layer arranged at the cathode lapping region and laminated one on another, and the planarization layer has an uneven surface at a junction between the cathode lapping region and the anode layer.

In a possible embodiment of the present disclosure, the surface of the planarization layer at the junction between the cathode lapping region and the anode layer includes convexes and concaves arranged alternately.

In a possible embodiment of the present disclosure, a thickness of a portion of the planarization layer at a position corresponding to each convex is greater than a thickness of a portion of the planarization layer at a position corresponding to each concave.

In a possible embodiment of the present disclosure, the OLED display substrate includes a planarization layer, a spacer layer, an anode layer and a cathode layer arranged at the cathode lapping region and laminated one on another, and at least one of the planarization layer or the spacer layer has an uneven surface at the cathode lapping region.

In a possible embodiment of the present disclosure, the OLED display substrate includes a planarization layer, a spacer layer, an anode layer and a cathode layer arranged at the cathode lapping region and laminated one on another, and the spacer layer has an uneven surface at a junction between the cathode lapping region and the anode layer.

In a possible embodiment of the present disclosure, the OLED display substrate includes a planarization layer, an anode layer, a spacer layer and a cathode layer arranged at the cathode lapping region and laminated one on another, and the planarization layer has an uneven surface at a junction between the cathode lapping region and the anode layer.

In a possible embodiment of the present disclosure, the surface of the planarization layer at the junction between the cathode lapping region and the anode layer includes convexes and concaves arranged alternately.

In a possible embodiment of the present disclosure, the spacer layer includes a plurality of protrusions arranged at the cathode lapping region, spaced apart from each other and corresponding to the convexes respectively.

In a possible embodiment of the present disclosure, the barrier structure includes a first barrier and a second barrier spaced apart from each other, a distance between the first barrier and the display region is smaller than a distance between the second barrier and the display region, and a level of the first barrier is located at a level lower than a level of the second barrier.

In another aspect, the present disclosure provides in some embodiments a method for manufacturing an OLED display substrate. The OLED display substrate includes a display region, a barrier structure arranged at a periphery of the OLED display substrate, and a cathode lapping region arranged between the display region and the barrier structure. The method includes providing the OLED display substrate with an uneven surface at the cathode lapping region.

In a possible embodiment of the present disclosure, the providing the OLED display substrate with the uneven surface at the cathode lapping region includes: depositing a layer of organic photosensitive material; exposing and developing the organic photosensitive material at the cathode lapping region with a gray tone mask or a half-tone mask, to form a pattern of a planarization layer, the planarization layer including a first portion and a second portion arranged at the cathode lapping region and spaced apart from each other, a thickness of the first portion having a thickness being greater than a thickness of the second portion; and forming an anode layer and a cathode layer sequentially on the pattern of the planarization layer, the anode layer and the cathode layer each having an uneven surface at the cathode lapping region.

In a possible embodiment of the present disclosure, the providing the OLED display substrate with the uneven surface at the cathode lapping region includes: forming a planarization layer; forming a spacer layer on the planarization layer, and applying a photoresist onto the spacer layer; exposing and developing the photoresist with a gray tone mask or a half-tone mask, to form a photoresist partially-reserved region, a photoresist fully-reserved region and a photoresist unreserved region; removing the spacer layer at the photoresist unreserved region; removing the photoresist at the photoresist partially-reserved region; removing a part of the spacer layer at the photoresist partially-reserved region; removing the photoresist at the photoresist fully reserved region to form a pattern of the spacer layer, the pattern of the spacer layer including a third portion and a fourth portion arranged at the cathode lapping region and spaced apart from each other, a thickness of the third portion being greater than a thickness of the fourth portion; and forming an anode layer and a cathode layer sequentially on the pattern of the spacer layer, the anode layer and the cathode layer each having an uneven surface at the cathode lapping region.

In yet another aspect, the present disclosure provides in some embodiments an OLED packaging structure, including the above-mentioned OLED display substrate and a packaging thin film layer covering the OLED display substrate. The OLED display substrate has an uneven surface facing the packaging thin film layer at the cathode lapping region.

In a possible embodiment of the present disclosure, the packaging thin film layer includes a first inorganic thin film, an organic thin film and a second inorganic thin film laminated one on another, and the first inorganic thin film adjacent to the OLED display substrate has an uneven surface at the cathode lapping region.

In still yet another aspect, the present disclosure provides in some embodiments a display device including the above-mentioned OLED packaging structure.

DETAILED DESCRIPTION

In order to make the objects, the technical solutions and the advantages of the present disclosure more apparent, the present disclosure will be described hereinafter in a clear and complete manner in conjunction with the drawings and embodiments.

Figure 1:
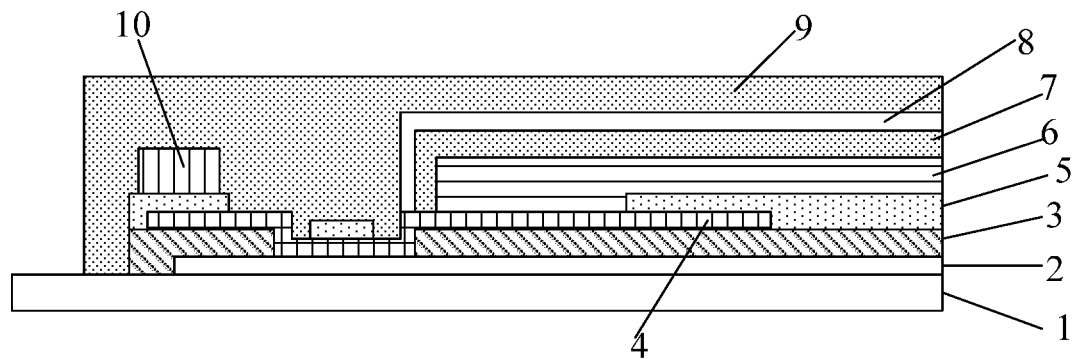
FIG. 1 is a sectional view of an OLED packaging structure.

As shown in FIG. 1 which is a sectional view of an OLED packaging structure in the related art, the OLED packaging structure includes OLED display elements on a flexible substrate 1. The OLED display elements include a thin film transistor array layer 2, a planarization layer 3, an anode layer 4, a pixel definition layer 5 and a cathode layer 6. The OLED packaging structure further includes a packaging layer covering the OLED display elements. The packaging layer includes a first inorganic thin film 7, an organic thin film 8 and a second inorganic thin film 9. During the formation of the organic thin film 8, a rheological organic material, e.g., an acrylic material, is applied to a to-be-filed region surrounded by a spacer layer 10 through an ink-jet printing process, and then solidified to form the organic thin film. When the rheological organic material extends beyond the to-be-filled region surrounded by the barrier, the hermeticity of the packaging thin film layer may be adversely affected, and thereby a display effect of a resultant display device may be adversely affected too.

An object of the present disclosure is to provide an OLED display substrate, a manufacturing method thereof, a packaging structure and a display device, so as to improve the hermeticity of the OLED packaging structure and ensure the display effect of the display device.

Figure 2:
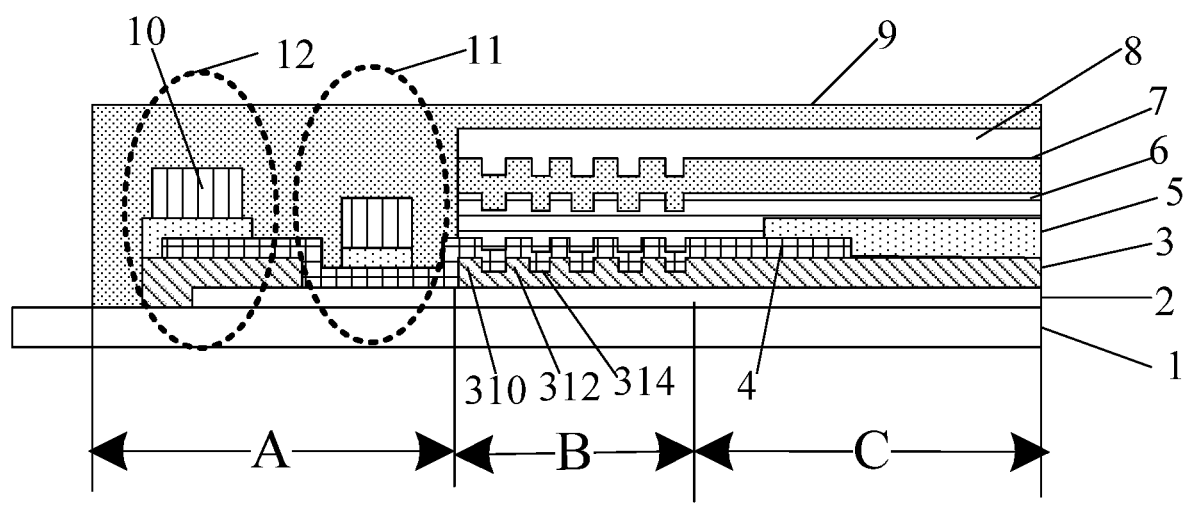
FIG. 2 is a sectional view of an OLED packaging structure according to some embodiments of the present disclosure.
Figure 3:
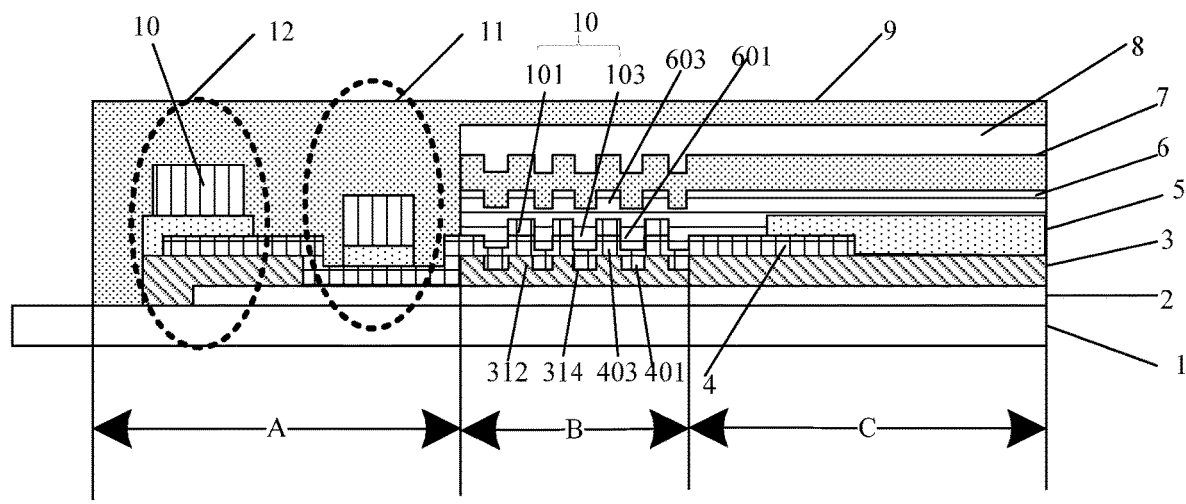
FIG. 3 is a sectional view of the OLED packaging structure according to some embodiments of the present disclosure.

The present disclosure provides in some embodiments an OLED display substrate which, as shown in FIGS. 2 and 3, includes a display region C, a barrier structure arranged at a periphery A of the OLED display substrate, and a cathode lapping region B arranged between the display region C and the barrier structure. The OLED display substrate has an uneven surface at the cathode lapping region B.

According to the embodiments of the present disclosure, the OLED display substrate has the uneven surface at the cathode lapping region. When an rheological organic material is applied to a to-be-filled region defined by the barrier structure through an ink-jet printing process so as to package the OLED display substrate, it is able to reduce a flow rate of the rheological organic material, and enable the rheological organic material to be solidified into an organic thin film before extending beyond the barrier structure, thereby to improve the hermeticity of an OLED packaging structure and ensure a display effect of a resultant display device.

As shown in FIG. 2, in a possible embodiment of the present disclosure, the OLED display substrate includes a planarization layer 3, an anode layer 4 and a cathode layer 6 arranged at the cathode lapping region B and laminated one on another. The planarization layer 3 has an uneven surface at the cathode lapping region B, so the anode layer 4 and the cathode layer 6 on the planarization layer 3 are each provided with an uneven surface, and finally the cathode lapping region B has an uneven surface. In FIG. 2, an upper surface or an upper portion 310 of the planarization layer 3 at the cathode lapping region B is uneven. For example, the upper surface or the upper portion 301 of the planarization layer 3 at the cathode lapping region B includes convexes 312 and concaves 314 arranged alternately. Each concave 314 may be formed as a groove between the convexes 312. A thickness of a portion of the planarization layer 3 at a position corresponding to each convex 312 is greater than a thickness of a portion of the planarization layer 3 at a position corresponding to each concave 314.

Usually, the anode layer 4 and the cathode layer 6 are each made of metal or a transparent conductive layer, so they may each have a relatively small thickness. When merely the anode layer 4 or the cathode layer 6 has the uneven surface, a fluctuation amplitude (i.e., a difference between a highest level and a lowest level) is relatively small, and at this time, the reduction of the flow rate of the rheological organic material may be very limited. The planarization layer 3 is made of organic resin, and it has a relatively large thickness. Hence, the planarization layer 3 may be provided with the uneven surface at the cathode lapping region, so as to effectively reduce the flow rate of the rheological organic material.

As shown in FIG. 3, in another possible embodiment of the present disclosure, the OLED display substrate includes the planarization layer 3, the anode layer 4, a spacer layer 10 and the cathode layer 6 arranged at the cathode lapping region B and laminated one on another. Usually, the anode layer 4 and the cathode layer 6 are each made of metal or a transparent conductive layer, so they may each have a relatively small thickness. When merely the anode layer 4 or the cathode layer 6 has the uneven surface, a fluctuation amplitude is relatively small, and at this time, reduction of the flow rate of the rheological organic material may be very limited. The planarization layer 3 is made of organic resin, and it has a relatively large thickness. Hence, the planarization layer 3 may be provided with the uneven surface at the cathode lapping region, so as to effectively reduce the flow rate of the rheological organic material.

Figure 4:
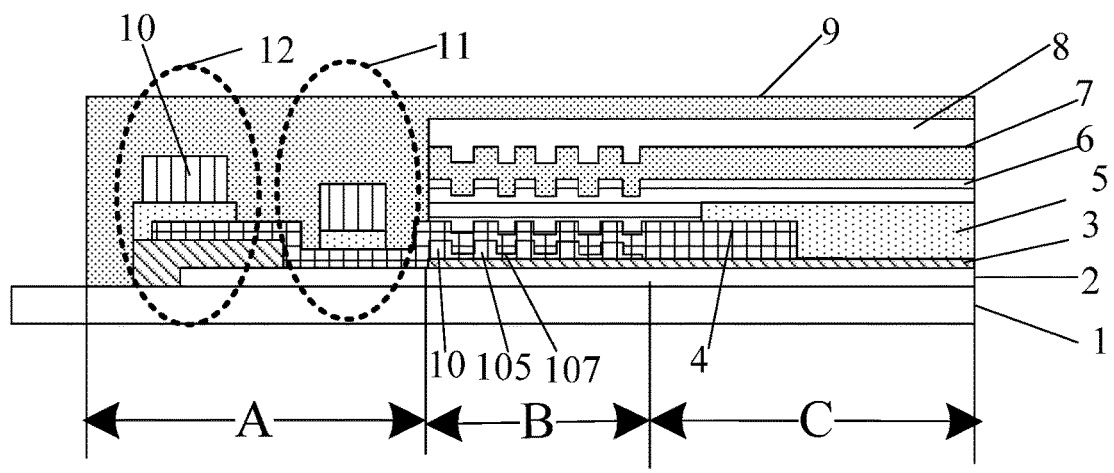
FIG. 4 is a sectional view of the OLED packaging structure according to some embodiments of the present disclosure.

In addition, the spacer layer 10 usually has a relatively large thickness, so the spacer layer 10 may also be provided with the uneven surface at the cathode lapping region, so as to effectively reduce the flow rate of the rheological organic material, as shown in FIG. 4.

In addition, both the planarization layer 3 and the spacer layer 10 may be provided with the uneven surfaces at the cathode lapping region B, so as to reduce the flow rate of the rheological organic material in a more effective manner. When both the planarization layer 3 and the spacer layer 10 are provided with the uneven surfaces at the cathode lapping region B, in a possible embodiment of the present disclosure, an orthogonal projection of a portion of the planarization layer 3 having a larger thickness onto the flexible substrate 1 coincides with an orthogonal projection of a portion of the spacer layer 10 having a larger thickness onto the flexible substrate 1, and an orthogonal projection of a portion of the planarization layer 3 having a smaller thickness onto the flexible substrate 1 coincides with an orthogonal projection of a portion of the spacer layer 10 having a smaller thickness onto the flexible substrate 1.

For example, in FIG. 3, the spacer layer 10 includes protrusions 101 and gaps 103 arranged alternately at the cathode lapping region B. In other words, the spacer layer 10 is not arranged continuously at the cathode lapping region B, and the protrusions 101 are spaced apart from each other. The protrusions 101 correspond to the convexes 312 respectively, and the gaps 103 correspond to the concaves 314 respectively. A first surface, e.g., a lower surface (viewed when the OLED packaging structure is located at a position as shown in FIG. 3), of the anode layer 4 is provided with a plurality of first protrusions 401 spaced apart from each other, and each first protrusion 401 extends into the corresponding concave 314. In other words, the plurality of first protrusions 401 on the first surface (e.g., the lower surface) of the anode layer 4 and the plurality of convexes 312 on the upper surface or upper portion 310 of the planarization layer 3 at the cathode lapping region B are arranged in a staggered manner. A second surface, e.g., an upper surface (viewed when the OLED packaging structure is located at the position as shown in FIG. 3) of the anode layer 4 is provided with a plurality of second protrusions 403 spaced apart from each other, and each second protrusion 403 is arranged above the corresponding convex 312 of the planarization layer 3. Each protrusion 101 of the spacer layer 10 is laminated on the corresponding second protrusion 403. A first surface, e.g., a lower surface (viewed when the OLED packaging structure is located at the position as shown in FIG. 3), of the cathode layer 6 is provided with a plurality of first protrusions 601 spaced apart from each other, and each first protrusion 601 extends into the corresponding gap 103 and further extends into between the corresponding second protrusions 403. A second surface, e.g., an upper surface (viewed when the OLED packaging structure is located at the position as shown in FIG. 3), of the cathode layer 6 is provided with a plurality of second protrusions 603 spaced apart from each other and corresponding to the protrusions 101 respectively.

As shown in FIGS. 2 and 3, different from the OLED packaging structure in the related art where merely one barrier is arranged at the periphery A of the OLED display substrate, in the embodiments of the present disclosure, a first barrier 11 and a second barrier 12 are arranged at the periphery A of the OLED display substrate and spaced apart from each other at a predetermined distance, so it is able to prevent the rheological organic material from extending beyond the barrier structure in a better manner.

As shown in FIGS. 2 and 3, the barrier structure includes the first barrier 11 and the second barrier 12 spaced apart from each other at the predetermined distance. A distance between the first barrier 11 and the display region C is smaller than a distance between the second barrier 12 and the display region C, and a level of the first barrier 11 (i.e., a height of the first barrier 11 relative to a bottom surface of the flexible substrate 1 as viewed when the flexible substrate 1 is located at a position as shown in FIG. 2) is smaller than a level of the second barrier 12 (i.e., a height of the second barrier 12 relative to the bottom surface of the flexible substrate 1 as viewed when the flexible substrate 1 is located at the position as shown in FIG. 2). In this way, the first barrier 11 and the second barrier 12 may form a step-like structure, so as to prevent the rheological organic material from extending beyond the barrier structure in a better manner.

The present disclosure further provides in some embodiments a method for manufacturing the OLED display substrate. As shown in FIGS. 2 and 3, the OLED display substrate includes the display region C, the barrier structure arranged at the periphery A of the OLED display substrate, and the cathode lapping region B arranged between the display region C and the barrier structure. The method includes providing the OLED display substrate with an uneven surface at the cathode lapping region.

According to the embodiments of the present disclosure, the OLED display substrate has the uneven surface at the cathode lapping region. When an rheological organic material is applied to a to-be-filled region defined by the barrier structure through an ink-jet printing process so as to package the OLED display substrate, it is able to reduce a flow rate of the rheological organic material, and enable the rheological organic material to be solidified into an organic thin film before extending beyond the barrier structure, thereby to improve the hermeticity of an OLED packaging structure and ensure a display effect of a resultant display device.

Usually, the anode layer 4 and the cathode layer 6 are each made of metal or a transparent conductive layer, so they may each have a relatively small thickness. When merely the anode layer 4 or the cathode layer 6 has the uneven surface, the fluctuation amplitude is relatively small, and at this time, the reduction of the flow rate of the rheological organic material may be very limited. The planarization layer 3 is made of organic resin, and it has a relatively large thickness. Hence, the planarization layer 3 may be provided with the uneven surface at the cathode lapping region, so as to effectively reduce the flow rate of the rheological organic material. The providing the OLED display substrate with the uneven surface at the cathode lapping region includes: depositing a layer of organic photosensitive material; exposing and developing the organic photosensitive material at the cathode lapping region B with a gray tone mask or a half-tone mask, so as to form a pattern of the planarization layer 3, the planarization layer 3 including a first portion (corresponding to the convexes 312 in FIG. 2) and a second portion (corresponding to the concaves 314 in FIG. 2) arranged at the cathode lapping region and spaced apart from each other, the first portion having a thickness greater than that of the second portion; and forming the anode layer 4 and the cathode layer 6 sequentially on the pattern of the planarization layer 3, the anode layer 4 and the cathode layer 6 each being provided with an uneven surface at the cathode lapping region B.

In addition, the spacer layer 10 usually has a relatively large thickness, so the spacer layer 10 may also be provided with the uneven surface at the cathode lapping region, so as to effectively reduce the flow rate of the rheological organic material. The providing the OLED display substrate with the uneven surface at the cathode lapping region includes: forming the planarization layer 3; forming the spacer layer 10 on the planarization layer 3 (as shown in FIG. 4), and applying a photoresist onto the spacer layer 10; exposing and developing the photoresist with a gray tone mask or a half-tone mask, so as to form a photoresist partially-reserved region, a photoresist fully-reserved region and a photoresist unreserved region; removing the spacer layer 10 at the photoresist unreserved region; removing the photoresist at the photoresist partially-reserved region; removing a part of the spacer layer 10 at the photoresist partially-reserved region; removing the photoresist at the photoresist fully reserved region to form a pattern of the spacer layer 10, the pattern of the spacer layer 10 including a third portion 105 and a fourth portion 107 arranged at the cathode lapping region B and spaced apart from each other, the third portion 105 having a thickness greater than that of the fourth portion 107; and forming the anode layer 4 and the cathode layer 6 sequentially on the pattern of the spacer layer 10 (as shown in FIG. 4), the anode layer 4 and the cathode layer 6 each being provided with an uneven surface at the cathode lapping region B.

Of course, both the planarization layer 3 and the spacer layer 10 may be provided with the uneven surfaces at the cathode lapping region B, so as to reduce the flow rate of the rheological organic material in a more effective manner. When both the planarization layer 3 and the spacer layer 10 are provided with the uneven surfaces at the cathode lapping region B, in a possible embodiment of the present disclosure, an orthogonal projection of the third portion onto the flexible substrate 1 coincides with an orthogonal projection of the first portion onto the flexible substrate 1, and an orthogonal projection of the fourth portion onto the flexible substrate 1 coincides with the orthogonal projection of the third portion onto the flexible substrate 1. The providing the OLED display substrate with the uneven surface at the cathode lapping region includes: depositing a layer of organic photosensitive material; exposing and developing the organic photosensitive material layer at the cathode lapping region B with a grey tone mask or a half-tone mask, so as to form a pattern of the planarization layer 3, the planarization layer 3 including a first portion (corresponding to the convexes 312 in FIG. 3) and a second portion (corresponding to the concaves 314 in FIG. 3) arranged at the cathode lapping region and spaced apart from each other, the first portion having a thickness greater than that of the second portion, as shown in FIG. 3; forming the anode layer 4 on the pattern of the planarization layer 3, the anode layer 4 being provided with an uneven surface at the cathode lapping region B; forming the spacer layer 10 on the anode layer 4 (as shown in FIG. 3), and applying a photoresist onto the spacer layer 10; exposing and developing the photoresist with a mask, so as to form a photoresist reserved region and a photoresist unreserved region; removing the spacer layer 10 at the photoresist unreserved region; removing the photoresist at the photoresist reserved region, so as to form the pattern of the spacer layer 10, the pattern of the spacer layer 10 including a third portion (corresponding to the protrusions 101) and a fourth portion (corresponding to the gaps 103) arranged at the cathode lapping region B and spaced apart from each other, the third portion having a thickness greater than that of the fourth portion (e.g., a thickness of the fourth potion may be zero); and forming the cathode layer 6 on the pattern of the spacer layer 10, the cathode layer 6 being provided with an uneven surface at the cathode lapping region B, as shown in FIG. 3.

When at least one of the planarization layer 3 or the spacer layer 10 has the uneven surface at the cathode lapping region, during the packaging of the OLED display elements, it is able to reduce the flow rate of the rheological organic material adopted in an ink-jet printing process through the uneven surface, thereby to solidify the rheological organic material into an organic film before extending beyond the barrier structure.

The present disclosure further provides in some embodiments an OLED packaging structure including the above-mentioned OLED display substrate and a packaging thin film layer covering the OLED display substrate. The OLED display substrate has an uneven surface facing the packaging thin film layer at the cathode lapping region. When an rheological organic material is applied to a to-be-filled region defined by the barrier structure through an ink-jet printing process so as to package the OLED display substrate, it is able to reduce a flow rate of the rheological organic material, and enable the rheological organic material to be solidified into an organic thin film before extending beyond the barrier structure, thereby to improve the hermeticity of the OLED packaging structure and ensure a display effect of a resultant display device.

As shown in FIGS. 2 and 3, the packaging thin film layer includes a first inorganic thin film 7, an organic thin film 8 and a second inorganic thin film 9 laminated one on another, and the first inorganic thin film 7 adjacent to the OLED display substrate has an uneven surface at the cathode lapping region.

To be specific, prior to the formation of the first inorganic thin film 7 on the OLED display substrate, the OLED display substrate has the uneven surface at the cathode lapping region B. In this way, after the formation of the first inorganic thin film 7 on the OLED display substrate, the first inorganic thin film 7 may also be provided with the uneven surface. When the rheological organic material is applied onto the first inorganic thin film 7 through the ink-jet printing process to form the organic thin film 8, it is able to reduce the flow rate of the rheological organic material through the uneven surface of the first inorganic thin film 7, and enable the rheological organic material to be solidified into the organic thin film before extending beyond the barrier structure, thereby to improve the hermeticity of the OLED packaging structure and ensure the display effect of the resultant display device.

As shown in FIG. 2, in a possible embodiment of the present disclosure, the OLED display substrate includes the planarization layer 3, the anode layer 4 and the cathode layer arranged at the cathode lapping region B and laminated one on another. Usually, the anode layer 4 and the cathode layer 6 are each made of metal or a transparent conductive layer, so they may each have a relatively small thickness. When merely the anode layer 4 or the cathode layer 6 has the uneven surface, a fluctuation amplitude is relatively small. The planarization layer 3 is made of organic resin, and it has a relatively large thickness. Hence, the planarization layer 3 may be provided with the uneven surface at the cathode lapping region, and thereby the anode layer 4, the cathode layer 6 and the first inorganic thin film 7 on the planarization layer 3 may each be provided with the uneven surface. Finally, when the rheological organic material is applied through the ink-jet printing process, the cathode lapping region B may also be provided with an uneven surface.

As shown in FIG. 3, the OLED display substrate includes the planarization layer 3, the anode layer 4, the spacer layer 10 and the cathode layer 6 arranged at the cathode lapping region B and laminated one on another. The spacer layer 10 usually has a relatively large thickness, so the spacer layer 10 may also be provided with an uneven surface at the cathode lapping region B, so as to effectively reduce the flow rate of the rheological organic material.

In addition, both the planarization layer 3 and the spacer layer 10 may be provided with the uneven surfaces at the cathode lapping region B, so as to reduce the flow rate of the rheological organic material in a more effective manner.

The present disclosure further provides in some embodiments a display device including the above-mentioned OLED packaging structure. The display device may include any product or member having a display function, e.g., television, display, digital photo frame, mobile phone or flat-panel computer. The display device may further include a flexible circuit board, a printed circuit board and a back plate.

Unless otherwise defined, any technical or scientific term used herein shall have the common meaning understood by a person of ordinary skills. Such words as "first" and "second" used in the specification and claims are merely used to differentiate different components rather than to represent any order, number or importance. Similarly, such words as "one" or "one of" are merely used to represent the existence of at least one member, rather than to limit the number thereof. Such words as "connect/connected to" or "couple/coupled to" may include electrical connection, direct or indirect, rather than to be limited to physical or mechanical connection. Such words as "on", "under", "left" and "right" are merely used to represent relative position relationship, and when an absolute position of the object is changed, the relative position relationship will be changed too.

It should be appreciated that, in the case that such an element as layer, film, region or substrate is arranged "on" or "under" another element, it may be directly arranged "on" or "under" the other element, or an intermediate element may be arranged therebetween.

The above embodiments are for illustrative purposes only, but the present disclosure is not limited thereto. Obviously, a person skilled in the art may make further modifications and improvements without departing from the spirit of the present disclosure, and these modifications and improvements shall also fall within the scope of the present disclosure.

What is claimed is:

1. An organic light-emitting diode (OLED) display substrate, comprising a display region, a barrier structure arranged at a periphery of the OLED display substrate, and a cathode lapping region arranged between the display region and the barrier structure, wherein the OLED display substrate has an uneven surface at the cathode lapping region,
wherein the OLED display substrate comprises a planarization layer, a spacer layer, an anode layer and a cathode layer arranged at the cathode lapping region and laminated one on another, and at least one of the planarization layer or the spacer layer has an uneven surface at the cathode lapping region.

2. The OLED display substrate according to claim 1, wherein the OLED display substrate comprises a planarization layer, an anode layer and a cathode layer arranged at the cathode lapping region and laminated one on another, and the planarization layer has an uneven surface at the cathode lapping region.

3. The OLED display substrate according to claim 1, wherein the OLED display substrate comprises a planarization layer, an anode layer and a cathode layer arranged at the cathode lapping region and laminated one on another, and the planarization layer has an uneven surface at a junction between the cathode lapping region and the anode layer.

4. The OLED display substrate according to claim 3, wherein the surface of the planarization layer at the junction between the cathode lapping region and the anode layer comprises convexes and concaves arranged alternately.

5. The OLED display substrate according to claim 4, wherein a thickness of a portion of the planarization layer at a position corresponding to each convex is greater than a thickness of a portion of the planarization layer at a position corresponding to each concave.

6. The OLED display substrate according to claim 1, wherein the spacer layer has an uneven surface at a junction between the cathode lapping region and the anode layer.

7. The OLED display substrate according to claim 1, wherein the planarization layer has an uneven surface at a junction between the cathode lapping region and the anode layer.

8. The OLED display substrate according to claim 7, wherein the surface of the planarization layer at the junction between the cathode lapping region and the anode layer comprises convexes and concaves arranged alternately.

9. The OLED display substrate according to claim 8, wherein the spacer layer comprises a plurality of protrusions arranged at the cathode lapping region, spaced apart from each other and corresponding to the convexes respectively.

10. The OLED display substrate according to claim 1, wherein the barrier structure comprises a first barrier and a second barrier spaced apart from each other, a distance between the first barrier and the display region is smaller than a distance between the second barrier and the display region, and a level of the first barrier is lower than a level of the second barrier.

11. An OLED packaging structure, comprising the OLED display substrate according to claim 1 and a packaging thin film layer covering the OLED display substrate, wherein the OLED display substrate has an uneven surface facing the packaging thin film layer at the cathode lapping region.

12. The OLED packaging structure according to claim 11, wherein the packaging thin film layer comprises a first inorganic thin film, an organic thin film and a second inorganic thin film laminated one on another, and the first inorganic thin film adjacent to the OLED display substrate has an uneven surface at the cathode lapping region.

13. A display device, comprising the OLED packaging structure according to claim 11.

14. A display device, comprising the OLED packaging structure according to claim 12.

15. A method for manufacturing an OLED display substrate, the OLED display substrate comprising a display region, a barrier structure arranged at a periphery of the OLED display substrate, and a cathode lapping region arranged between the display region and the barrier structure, wherein the method comprises providing the OLED display substrate with an uneven surface at the cathode lapping region;
- wherein the providing the OLED display substrate with the uneven surface at the cathode lapping region comprises:
- depositing a layer of organic photosensitive material;
- exposing and developing the organic photosensitive material at the cathode lapping region with a gray tone mask or a half-tone mask, to form a pattern of a planarization layer, the planarization layer comprising a first portion and a second portion arranged at the cathode lapping region and spaced apart from each other, a thickness of the first portion being greater than a thickness of the second portion; and
- forming an anode layer and a cathode layer sequentially on the pattern of the planarization layer, the anode layer and the cathode layer each having an uneven surface at the cathode lapping region.

16. The method according to claim 15, wherein the providing the OLED display substrate with the uneven surface at the cathode lapping region comprises:
- forming a planarization layer;
- forming a spacer layer on the planarization layer, and applying a photoresist onto the spacer layer;
- exposing and developing the photoresist with a gray tone mask or a half-tone mask, to form a photoresist partially-reserved region, a photoresist fully-reserved region and a photoresist unreserved region;
- removing the spacer layer at the photoresist unreserved region;
- removing the photoresist at the photoresist partially-reserved region;
- removing a part of the spacer layer at the photoresist partially-reserved region;
- removing the photoresist at the photoresist fully reserved region to form a pattern of the spacer layer, the pattern of the spacer layer comprising a third portion and a fourth portion arranged at the cathode lapping region and spaced apart from each other, a thickness of the third portion being greater than a thickness of the fourth portion; and
- forming an anode layer and a cathode layer sequentially on the pattern of the spacer layer, the anode layer and the cathode layer each having an uneven surface at the cathode lapping region.

17. An organic light-emitting diode (OLED) display substrate, comprising a display region, a barrier structure arranged at a periphery of the OLED display substrate, and a cathode lapping region arranged between the display region and the barrier structure, wherein the OLED display substrate has an uneven surface at the cathode lapping region,
- wherein the OLED display substrate comprises a planarization layer, a spacer layer, an anode layer and a cathode layer arranged at the cathode lapping region and laminated one on another, and the spacer layer or the planarization layer has an uneven surface at a junction between the cathode lapping region and the anode layer.

* * * * *